United States Patent
Oh et al.

(10) Patent No.: US 9,123,882 B2
(45) Date of Patent: Sep. 1, 2015

(54) APPARATUS FOR GENERATING VIBRATIONS

(71) Applicant: SAMSUNG ELECTRO-MECHANICS CO., LTD., Suwon (KR)

(72) Inventors: Hwa Young Oh, Suwon (KR); Dong Su Moon, Suwon (KR); Sang Jin Lee, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 249 days.

(21) Appl. No.: 13/866,572

(22) Filed: Apr. 19, 2013

(65) Prior Publication Data

US 2014/0152148 A1    Jun. 5, 2014

(30) Foreign Application Priority Data

Dec. 3, 2012  (KR) .................. 10-2012-0139256

(51) Int. Cl.
| | | |
|---|---|---|
| *H01L 41/053* | (2006.01) | |
| *G06F 3/01* | (2006.01) | |
| *H01L 41/09* | (2006.01) | |
| *B06B 1/06* | (2006.01) | |
| *B06B 3/00* | (2006.01) | |

(52) U.S. Cl.
CPC ............ *H01L 41/053* (2013.01); *B06B 1/0648* (2013.01); *B06B 3/00* (2013.01); *G06F 3/016* (2013.01); *H01L 41/0933* (2013.01)

(58) Field of Classification Search
CPC . H03H 9/0514; H03H 9/0547; H03H 9/1035; H03H 9/173; H03H 9/174; H01L 41/053; H01L 41/0926; H01L 41/39; H01L 41/1132; G01P 15/0915; G01L 1/16
USPC ............... 310/323.01–323.21, 324, 328, 329, 310/348–353
See application file for complete search history.

(56) References Cited

U.S. PATENT DOCUMENTS

| | | | | |
|---|---|---|---|---|
| 4,965,483 | A | * | 10/1990 | Abe et al. ....................... 310/324 |
| 5,229,744 | A | * | 7/1993 | Ogura ............................ 340/7.6 |

(Continued)

FOREIGN PATENT DOCUMENTS

| | | |
|---|---|---|
| JP | 5-122952 | 5/1993 |
| JP | 5-191988 | 7/1993 |

(Continued)

OTHER PUBLICATIONS

Japanese Office Action issued Apr. 30, 2014 in corresponding Japanese Patent Application No. 2013-084280.
Korean Office Action mailed Feb. 11, 2014 in corresponding Korean Application No. 10-2012-0139256.

*Primary Examiner* — Thomas Dougherty

(57) ABSTRACT

There is provided an apparatus for generating vibrations including: a housing having an internal space; a direction changing member installed in the housing so as to be disposed in the internal space; a piezoelectric actuator including a piezoelectric element fixed to the direction changing member such that a horizontal deformation thereof is restrained, and deforming the direction changing member by a horizontal deformation thereof; and a vibrator fixed to the direction changing member and vertically displaced in a vertical direction according to a vertical deformation of the piezoelectric actuator.

23 Claims, 5 Drawing Sheets

(56) References Cited

U.S. PATENT DOCUMENTS

| | | | | |
|---|---|---|---|---|
| 5,780,958 | A * | 7/1998 | Strugach et al. | 310/348 |
| 2009/0058227 | A1 | 3/2009 | Takahashi et al. | |
| 2009/0096326 | A1 | 4/2009 | Onishi et al. | |
| 2009/0236939 | A1 * | 9/2009 | Heim | 310/324 |
| 2010/0165794 | A1 * | 7/2010 | Takahashi et al. | 367/189 |
| 2012/0212100 | A1 | 8/2012 | Lee | |
| 2013/0106239 | A1 * | 5/2013 | Yun et al. | 310/300 |
| 2013/0300261 | A1 * | 11/2013 | Kim et al. | 310/348 |

FOREIGN PATENT DOCUMENTS

| | | |
|---|---|---|
| JP | 2009-38901 | 2/2009 |
| JP | 2011-206634 | 10/2011 |
| JP | 2012-100042 | 5/2012 |
| JP | 2012-165155 | 8/2012 |
| KR | 10-2006-0000894 | 1/2006 |
| KR | 10-1157868 | 6/2012 |
| KR | 10-2012-0075939 | 7/2012 |
| WO | WO 2007/026736 | 3/2007 |

* cited by examiner

APPARATUS FOR GENERATING VIBRATIONS

CROSS-REFERENCE TO RELATED APPLICATIONS

This application claims the priority of Korean Patent Application No. 10-2012-0139256 filed on Dec. 3, 2012, in the Korean Intellectual Property Office, the disclosure of which is incorporated herein by reference.

BACKGROUND OF THE INVENTION

1. Field of the Invention

The present invention relates to an apparatus for generating vibrations.

2. Description of the Related Art

An apparatus for generating vibrations, a component for converting electrical energy into mechanical vibrations by using a genetic principle of the generation of electromagnetic force, is installed in a portable phone so as to be used for silently notifying a user of receipt of an incoming call.

The rapid expansion of the cellular phone market has promoted the addition of a variety of functions to portable phones. In line with this trend, components of portable phones have been required to be smaller and have high quality. In the case of an apparatus for generating vibrations, the development of a product having a novel structure that may improve shortcomings of existing products and having remarkably improved quality has been required.

As portable phones having large LCD screens have been increasingly launched onto the market in recent years, a touch screen scheme has been adopted and an apparatuses for generating vibrations have also been used to generate vibrations in the event of a touch.

An apparatus for generating vibrations used in portable phones employing a touch screen is more frequently used in the event of a touch than in the event of receipt of an incoming call, so it is required to have a longer operational lifespan and a fast response speed in line with a speed at which a user touches a touch screen.

To meet the requirements of lifespan and responsiveness, currently, portable phones employing a touch screen also employ a linear vibrator.

Rather than using a principle of a motor rotating an unbalanced weight, in a linear vibrator, a mass body hanging on a spring installed therein makes a linear resonant motion by electromagnetic force generated by a coil and a magnet to generate vibrations.

Alternatively, a piezoelectric element may be used as an actuator to enable a mass body to make a linear resonant motion, according to contraction and expansion of the piezoelectric element to generate vibrations.

As the elastic member, a spring is generally used, and a leaf spring, a coil spring, or the like, is used. However, a lifespan of a spring is limited due to fracture (or destruction) of the spring. Also, when physical properties of a spring are changed due to a climate condition, or the like, the spring is readily fractured.

In addition, when a spring is abnormal (i.e., distorted, horizontally shaken, or the like), vibrations may be weakened noise may be generated.

SUMMARY OF THE INVENTION

An aspect of the present invention provides an apparatus for generating vibrations capable of implementing rapid responsiveness by using a linear elastic member, while utilizing a piezoelectric element as an actuator.

Another aspect of the present invention provides a piezoelectric actuator in which vertically laminated electrodes are connected in a central portion which is not substantially changed.

According to an aspect of the present invention, there is provided an apparatus for generating vibrations, including: a housing having an internal space; a direction changing member installed in the housing so as to be disposed in the internal space; a piezoelectric actuator including a piezoelectric element fixed to the direction changing member such that a horizontal deformation thereof is restrained, and deforming the direction changing member by a horizontal deformation thereof; and a vibrator fixed to the direction changing member and vertically displaced in a vertical direction according to a vertical deformation of the piezoelectric actuator.

The direction changing member may include: a fixed end fixed to the housing; horizontal portions extending from the fixed end to both sides in a horizontal direction; vertical portions extending from horizontal outer portions of the horizontal portions downwardly in a vertical direction; and displacement extending portions extending from vertical lower portions of the vertical portions to both sides in a horizontal direction and having the vibrator fixed to both sides thereof in the horizontal direction.

The piezoelectric actuator may be provided in a space formed by the horizontal portions and the vertical portions.

A vertical directional upper portion of the piezoelectric actuator may be attached to horizontal portions.

Horizontal directional both ends of the piezoelectric actuator may be attached to the vertical portions.

The vertical directional upper portion and the horizontal directional both ends of the piezoelectric actuator may be attached to the horizontal portions and the vertical portions.

Portions of the displacement extending portions coupled to the vertical portions may be lower than portions thereof fixed to the vibrator in a vertical direction.

The displacement extending portions may include a coupling portion whose portion fixed to the vibrator is parallel to a horizontal direction.

The horizontal portions and the vertical portions may be coupled at a right angle.

The horizontal portions may be warped as the piezoelectric actuator is deformed in a horizontal direction.

The housing may include a bracket on which the direction changing member is installed, and a case covering the bracket and incorporated with the bracket to provide an internal space.

The apparatus may further include a board attached to the bracket and providing power to the piezoelectric actuator.

The vibrator may be a weight made of a high specific gravity material.

The weight may be longer than the piezoelectric actuator in the horizontal direction.

The weight may include a weight adding portion extending downwardly in a vertical direction on an outer side of the outer end of the piezoelectric actuator.

A damper may be provided in at least one member in a portion where the vibrator and an inner surface of the housing face one another.

The damper may be disposed on an outer end of the vibrator or an inner surface of the housing facing the outer end of the vibrator.

The damper may be made of a material including at least one of urethane foam, silicon foam, and rubber.

The damper may be made of a material which is elastic and absorbs noise.

The damper may be formed of at least one coil spring.

The piezoelectric actuator may have a square pillar shape in which a length thereof in a horizontal direction is greater than a height thereof in a vertical direction.

The housing may have a square pillar shape in which a length thereof in a horizontal direction is greater than a height thereof in a vertical direction.

The direction changing member may include: a fixed end fixed to the housing; at least two horizontal portions extending from the fixed end to both sides in a horizontal direction; vertical portions extending from horizontal outer portions of the horizontal portions downwardly in a vertical direction; and displacement extending portions extending from vertical lower portions of the vertical portions to both sides in a horizontal direction and having the vibrator fixed to both sides thereof in the horizontal direction.

The piezoelectric actuator may be provided in a space formed by the horizontal portions and the vertical portions.

According to another aspect of the present invention, there is provided an apparatus for generating vibrations, including: a housing having an internal space; a direction changing member installed in the housing so as to be disposed in the internal space; a piezoelectric actuator including a piezoelectric element fixed to the direction changing member such that a deformation thereof in one direction is restrained, and deforming the direction changing member by a deformation thereof in one direction; and a vibrator fixed to the direction changing member and displaced in a direction perpendicular to the one direction according to a deformation of the piezoelectric actuator in the one direction.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
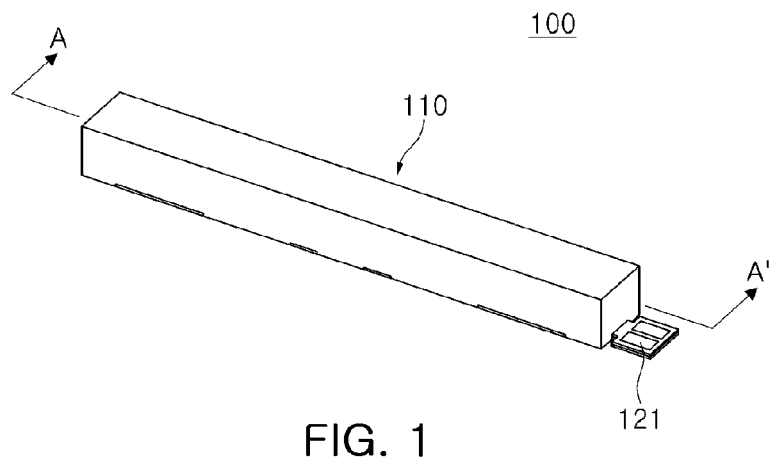
FIG. 1 is a perspective view of an apparatus for generating vibrations according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 2A:
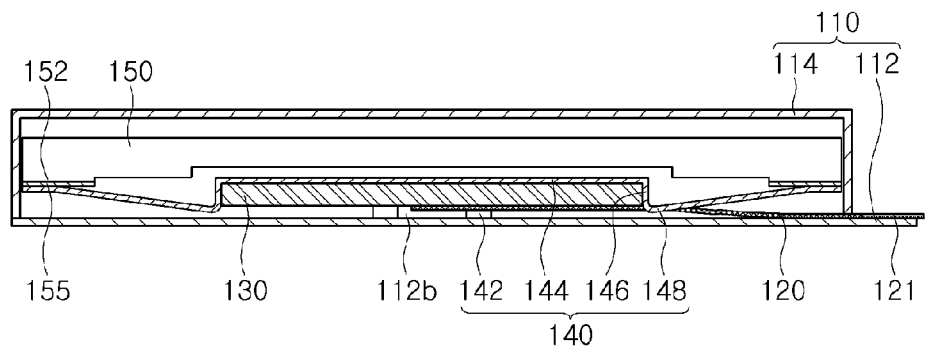
FIGS. 2A through 2C are cross-sectional views of the apparatus for generating vibrations of FIG. 1 taken along line a portion A-A'.
Figure 2B:
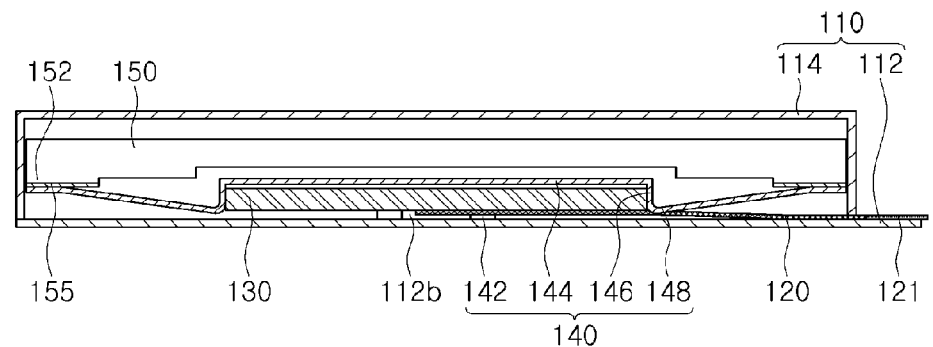
Figure 2C:
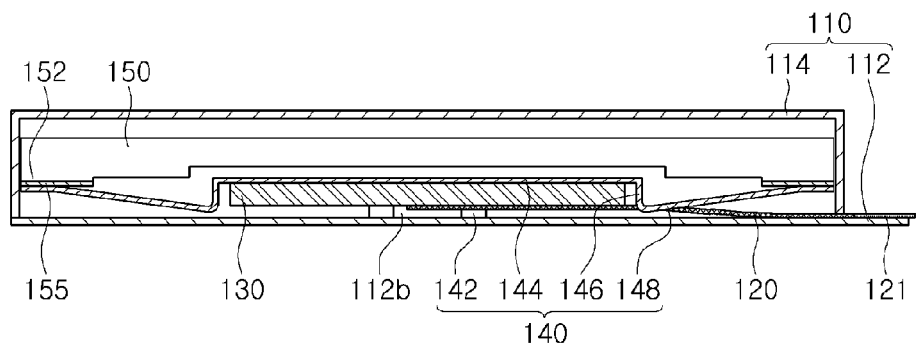
Figure 3:
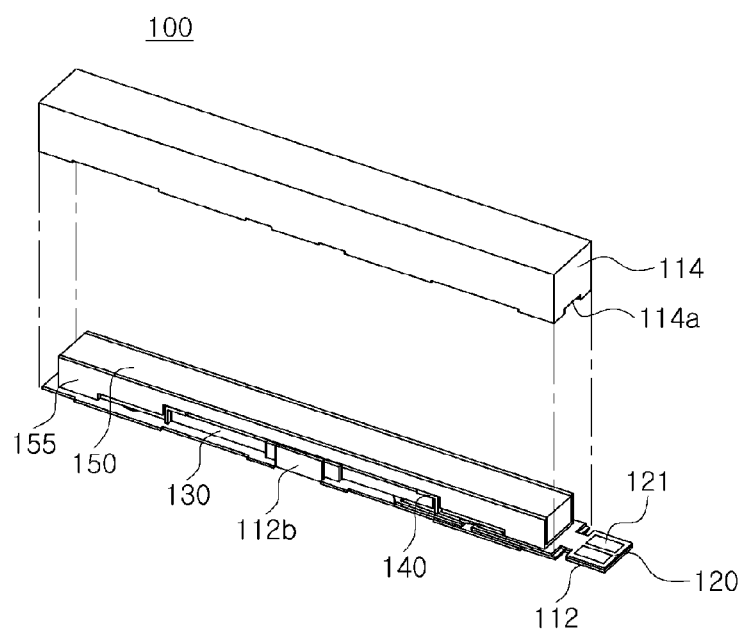
FIG. 3 is a coupled perspective view of the apparatus for generating vibrations according to an embodiment of the present invention.
Figure 4:
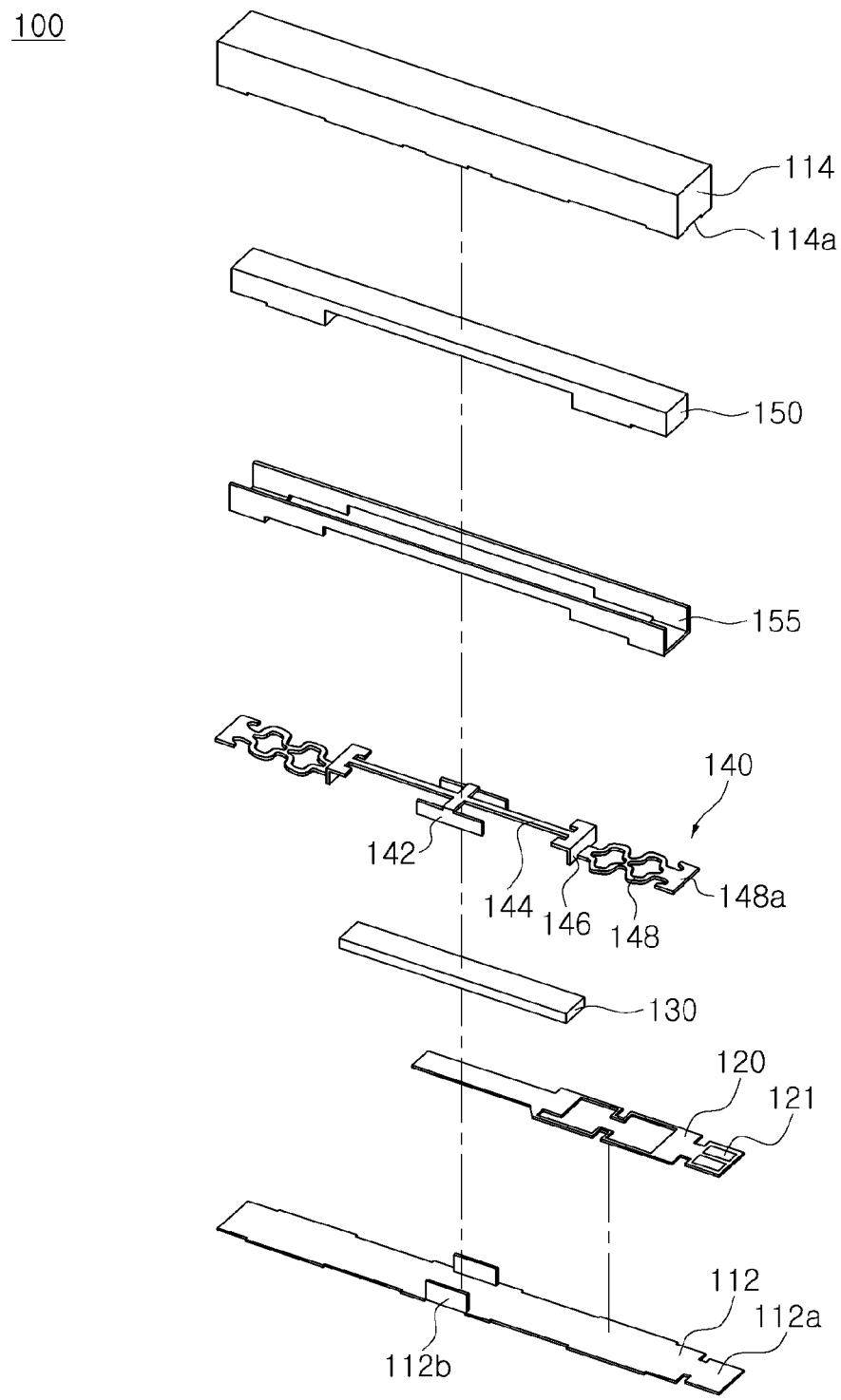
FIG. 4 is an exploded perspective view of the apparatus for generating vibrations according to an embodiment of the present invention.

FIG. 1 is a perspective view of an apparatus for generating vibrations according to an embodiment of the present invention. FIGS. 2A through 2C are cross-sectional view of the apparatus for generating vibrations of FIG. 1 taken along line a portion A-A'. FIG. 3 is a coupled perspective view of the apparatus for generating vibrations according to an embodiment of the present invention. FIG. 4 is an exploded perspective view of the apparatus for generating vibrations according to an embodiment of the present invention.

Referring to FIGS. 1 through 4, an apparatus for generating vibrations 100 according to an embodiment of the present invention may include a housing 110 forming the exterior of the apparatus for generating vibrations 100, a board 120 providing power, piezoelectric actuator 130 contracting and expanding in a horizontal direction according to a power supplied thereto, a direction changing member 140 fixed in the housing 110 and having the piezoelectric actuator 130 mounted thereon, and a vibrator (or a weight) 150 fixed to the direction changing member 140, a vertical displacement of the vibrator 150 being changed according to a horizontal deformation of the piezoelectric actuator 130.

Also, an apparatus for generating vibrations according to an embodiment of the present invention may selectively include dampers 161 and 162, coil springs 171 and 172, or the like, as described hereinafter with reference to FIGS. 6 and 7.

First, directional terms are defined as follows. In FIGS. 2A, 2B, and 2C, a horizontal direction may refer to a left-right direction, namely, a direction (i.e., a length direction) from one end of the piezoelectric actuator 130 or the vibrator 150 toward the other end thereof, and a vertical direction may refer to an upward or a downward direction, namely, a direction (i.e., a height direction) from the bottom of the piezoelectric actuator 30 or the vibrator 150 toward the top thereof. However, the horizontal direction may not refer to a particular direction but include any direction as long as it is on a horizontal plane, and the vertical direction may include any direction as long as it is perpendicular to the horizontal direction.

Meanwhile, with respect to a member of which any one of width and length thereof is longer, a width direction may refer to a direction having a shorter length. For example, in case that the width is longer than the length, a vertical direction may be a width direction. Here, the width direction may be a horizontal direction (i.e., a length direction) as described above Also, a main surface may be the largest surface of a predetermined member, e.g., the piezoelectric actuator 130 or the vibrator 150.

Also, an outer side of the predetermined member may refer to a leftward-rightward direction in a horizontal direction substantially based on the center of the vibrator 150, and conversely, an inner side of the predetermined member may refer to a substantially central direction of the vibrator 150 in the leftward-rightward direction in the horizontal direction.

The housing 110 has an inner space and forms the exterior of the apparatus 100 for generating vibrations. The housing 110 may include a bracket 112 and a case 114. A direction changing member 140 may be installed on the bracket 112. Also, the board 120 may be installed on the bracket 112.

Also, the case 114 may cover the bracket 112 and may be incorporated with the bracket 112 to provide an internal space.

Here, in an embodiment of the present invention, the board 120 or the direction changing member 140 are installed on the bracket 112, but the present invention is not limited thereto and the board 120 or the direction changing member 140 may be installed on the case 114.

The bracket 112 may have a plate-like shape to allow a member to be easily installed thereon. Also, the case 114 may have a box-like shape with an opened lower surface, i.e., a hexahedral shape, to cover the entirety of the bracket 112.

Of course, the shape of the bracket 112 or the case 114 is not limited thereto and may have various other shapes. For example, the bracket 112 may be provided as a circular plate and the case may have a cylindrical shape covering the circular plate to provide an internal space.

The board 120 may be fixedly installed on the bracket 112. The board 120 may be installed on an inner surface of the housing 110 so as to be positioned in the internal space of the housing 110 or may be installed on an outer surface of the housing 110. The board 120 may be a printed circuit board, specifically, a flexible PCB (FPCB). Hereinafter, a case in which the substrate 120 is installed on an inner surface of the housing 110 will be described as an embodiment.

Also, in the case that the board 120 is installed on an inner surface of the housing 110, the board 120 may include a terminal connection portion 121 exposed to the outside of the housing 110.

The housing 110 may have a through hole 114a allowing the terminal connection portion 121 to be exposed therethrough. In particular, the through hole 114a may be provided in an end portion of the case 114 in a horizontal direction. In addition, the bracket 112 includes a terminal support portion 112a provided in a position corresponding to the position of the through hole 114a and outwardly protruded, and the terminal connection portion 121 may extend to an upper surface of the terminal support portion 112a.

Meanwhile, the board 120 may be fixedly installed on an upper surface of the bracket 112. In an embodiment of the present invention, the vibrator vibrates in the internal space, so the board 120 may be fixed to the bracket 112 such that it is not in contact with the vibrator, and extend to a portion where the piezoelectric actuator 130 is positioned, so as to be connected to the piezoelectric actuator 130.

Also, the bracket 112 may include a connection portion 112b to which the direction changing member 140 is fixedly installed. In detail, a fixed end 142 (to be described hereinafter) of the direction changing member 140 may be coupled to the connection portion 112b. The connection portion 112b may be substantially provided in the center of the bracket 112 and may have a plate-like shape protruded upwardly in a vertical direction at both sides of the bracket 112 in a width direction. Of course, the fixed end 142 may have a shape corresponding thereto. The connection portion 112b and the fixed end 142 may be connected through a coupling means such as welding, by applying an adhesive, or the like.

The direction changing member 140 may be installed to be positioned in the internal space of the housing 110. The direction changing member 140 may have the vibrator 150 (or a weight) (to be described hereinafter) installed on an upper portion thereof. The direction changing member 140 may cause a vertical displacement of the vibrator 150 installed on an upper portion thereof according to a horizontal deformation (i.e., expansion or contraction) of the piezoelectric actuator 130 installed therein.

The direction changing member 140 according to an embodiment of the present invention may include an elastic member extending outwardly in the horizontal direction based on the center of the apparatus 100 for generating vibrations, and in this case, the elastic member is deformed in a vertical direction according to a horizontal deformation of a piezoelectric element installed on the elastic member.

In detail, the direction changing member 140 according to one embodiment of the present invention may include the fixed end 142 fixed to the housing 110, at least two horizontal portions 144 extending from the fixed end 142 in a horizontal direction, vertical portions 146 extending from horizontal outer portions of the horizontal portions 144 downwardly in a vertical direction, and displacement extending portions 148 extending from vertical lower portions of the vertical portions 146 to both sides in a horizontal direction and having the vibrator 150 fixed to both sides thereof in the horizontal direction.

Here, the piezoelectric element provided in the piezoelectric actuator 130 may be provided in a space formed by the horizontal portion 144 and the vertical portion 146.

In the present embodiment, two or more horizontal portions 144 may be provided, and thus, two or more vertical portions 146 and displacement extending portions 148 may extend from the horizontal portions 144 in a corresponding manner.

Hereinafter, for the purposes of description, the case in which two horizontal portions 144 are provided will be described with reference to the accompanying drawings.

The direction changing member 140 according to the present embodiment may include the fixed end 142 fixed to the housing 110, the horizontal portions 144 extending from the fixed end 142 to both sides in the horizontal direction, the vertical portions 146 extending from horizontal outer portions of the horizontal portions 144 downwardly in a vertical direction, and the displacement extending portions 148 extending from vertical lower portions of the vertical portions 146 to both sides in a horizontal direction and having the vibrator 150 fixed to both sides thereof in the horizontal direction.

The fixed end 142 may be fixedly installed in the connection portion 112b provided in the bracket 112. The fixed end 142 may have a shape corresponding to the connection portion 112b.

The horizontal portions 144 may extend from the fixed end 142 to both sides in the horizontal direction.

The horizontal portions 144 may be warped. The horizontal portions 144 may be substantially parallel to the horizontal direction.

Next, the vertical portions 146 may extend from horizontal outer portions of the horizontal portions 144 downwardly in a vertical direction. The horizontal portions 144 may be combined to the vertical portions 146 at a right angle.

Here, a width of the horizontal portion 144 may be shorter than a width of the vertical portion 146 to facilitate elastic deformation.

The piezoelectric actuator 130 may be provided in a space formed by the horizontal portions 144 and the vertical portions 146. Namely, the piezoelectric actuator 130 may be fixed in the space formed by the horizontal portions 144 and the vertical portions 146 such that a horizontal deformation thereof is restrained, to deform the direction changing member 140 (i.e., to change a shape of the direction changing member 140) by horizontal deformation thereof. Thus, a vertical upper portion of the piezoelectric actuator 130 may be attached to the horizontal portions 144 (please see FIG. 2B). Also, both horizontal ends of the piezoelectric actuator 130 may be attached to the vertical portions 146 (please see FIG. 2C). Alternatively, vertical upper portions and both horizontal ends of the piezoelectric actuator 130 may be attached to the horizontal portions 144 and the vertical portions 146 (please see FIG. 2A).

Meanwhile, the displacement extending portions 148 may extend from the vertical lower portions of the vertical portions 146 to outer sides in the horizontal direction and having the vibrator 150 fixed to horizontal outer portions thereof. Namely, the displacement extending portions 148 may extend from the vertical lower portions of the vertical portion 146 to outer sides in a horizontal direction to expand a vertical displacement of the vibrator 150. Namely, the vertical portions 146 are coupled to the horizontal portions 144 and the horizontal portions 144 are warped in a vertical direction. Thus, the portions maximally outwardly extending from the vertical portions 146 in the horizontal direction may be maximally warped in the vertical direction.

Here, in order to maximize space utilization of the small apparatus 100 for generating vibrations according to the present embodiment, the portions of the displacement extending portions 148 coupled to the vertical portions 144 may be lower in the vertical direction than portions fixed to the vibrator 150. Namely, the displacement extending portions 148 may be sloped upwardly in the vertical direction from the portions thereof coupled to the vertical portions 144 toward outer sides in the horizontal direction.

Also, the vibrator 150 may be fixed to horizontal outer portions of the displacement extending portions 148. The displacement extending portions 148 may include coupling portions 148a formed on horizontal outer portions, to which the vibrator 150 is fixed, such that it is parallel to the horizontal direction.

Meanwhile, the displacement extending portion 148 may have a shape having a plurality of holes formed therein so as to be easily elastically deformed.

Hereinafter, a warping mechanism of the horizontal portions 144 based on the structure in which the piezoelectric actuator is coupled to the horizontal portions 144 and the vertical portions 146 will be described.

In the case that the vertical upper portion of the piezoelectric actuator is attached to the horizontal portions 144 (please see FIG. 2B), when the piezoelectric actuator is deformed lengthwardly in a horizontal direction, the horizontal portions 144 to which the piezoelectric actuator 130 is detained may be warped. Namely, when the length of the piezoelectric actuator is deformed in a horizontal direction, the horizontal portions 144, whose length is not deformed, are warped. In this case, the horizontal portions 144 may be warped such that both ends, based on the center of the piezoelectric actuator, are bent upwardly or downwardly in a vertical direction. In other words, when the length of the piezoelectric actuator elongates in a horizontal direction, both ends of the horizontal portions 144 may be bent upwardly in a vertical direction. Also, when the length of the piezoelectric actuator is reduced in a horizontal direction, both ends of the horizontal portions 144 may be bent downwardly in a vertical direction.

In case that both horizontal ends of the piezoelectric actuator are attached to the vertical portions 146 (in the case of FIG. 2C), when the length of the piezoelectric actuator is changed in a horizontal direction, the vertical portions 146 to which the piezoelectric actuator is detained is pushed or pulled to both sides in a horizontal direction based on the center of the piezoelectric actuator. In this case, since the vertical portions 146 extend downwardly from outer ends of the horizontal portions 144 in a vertical direction. Torque is generated based on the portions in which the horizontal portions 144 and the vertical portions 146 meet, causing the horizontal portions 144 to be warped. In this case, the horizontal portions 144 are warped such that both ends thereof, based on the center of the piezoelectric actuator, are bent upwardly or downwardly in a horizontal direction. In other words, when the length of the piezoelectric actuator elongates in a horizontal direction, the vertical portions 146 are pushed outwardly, so the both ends of the horizontal portions 144 may be bent upwardly in a vertical direction. Also, when the length of the piezoelectric actuator is reduced in a horizontal direction, the vertical portions 146 are pulled inwardly, so both ends of the horizontal portions 144 may be bent downwardly in a vertical direction.

In the case that the vertical upper portions and the both horizontal ends of the piezoelectric actuator are attached to the horizontal portions 144 and the vertical portions 146 (i.e., in the case of FIG. 2A), the two foregoing cases may take place in a complex manner. Namely, warping of the horizontal portions 144 due to a difference between horizontal deformations of the horizontal portions 144 and the piezoelectric actuator and warping of the horizontal portions 144 due to a displacement of the vertical portions 146 in both sides may occur concurrently. In this case, a vertical deformation of the direction changing member 140 may be more effective.

Figure 5A:
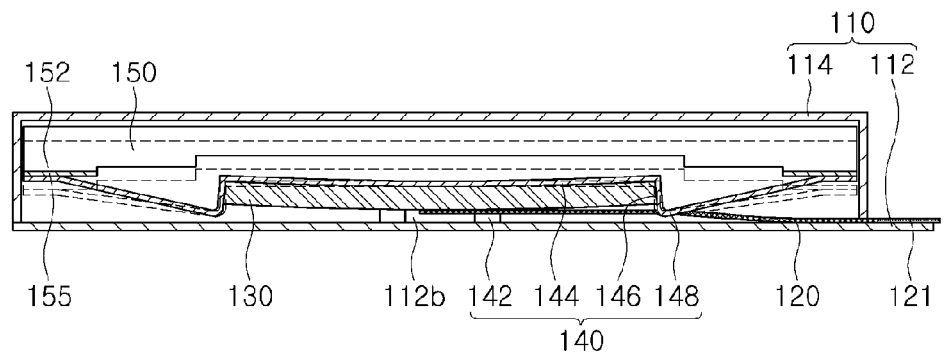
FIGS. 5A and 5B are views illustrating an operation of the apparatus for generating vibrations according to an embodiment of the present invention.
Figure 5B:
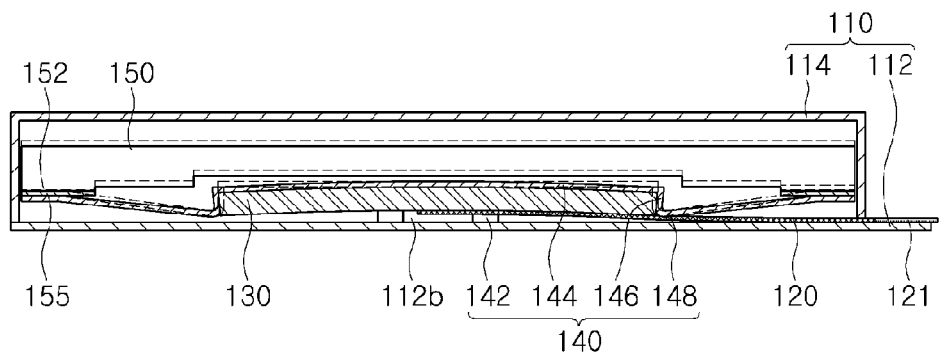

In detail, FIG. 5A illustrates a configuration in which the piezoelectric actuator 130 expands in a horizontal direction, and FIG. 5B illustrates a configuration in which the piezoelectric actuator 130 contracts in a horizontal direction.

Referring to FIG. 5A, as the piezoelectric actuator 130 expands in a horizontal direction, the horizontal outer ends of the horizontal portions 144 are warped upwardly in a vertical direction. Thus, horizontal outer portions of the displacement extending portion 148 extending from the horizontal portions 144 in a horizontal direction by the medium of the vertical portions 146 are lifted upwardly in a vertical direction. Accordingly, the vibrator 150 coupled to the horizontal outer portions of the displacement extending portions 148 is displaced upwardly in a vertical direction.

Referring to FIG. 5B, as the piezoelectric actuator 130 contracts in a horizontal direction, the horizontal outer ends of the horizontal portions 144 are warped downwardly in a vertical direction. Accordingly, the horizontal outer portions of the displacement extending portion 148 extending from the horizontal portions 144 by the medium of the vertical portions 146 in a horizontal direction are flowered downwardly in a vertical direction. Accordingly, the vibrator 150 coupled to the horizontal outer portions of the displacement extending portions 148 is displaced downwardly in a vertical direction.

As illustrated in FIGS. 5A and 5B, as the piezoelectric actuator 130 expands and contracts iteratively in a horizontal direction, the vibrator 150 installed on an upper end of the direction changing member 140 vibrates downwardly or upwardly in a vertical direction.

The piezoelectric actuator 130 may be installed in the direction changing member 140. In detail, the piezoelectric actuator 130 may be disposed in a space formed by the vertical portions 144 and the horizontal portions 146. In an embodiment of the present invention, the piezoelectric actuator 130 may have a structure in which electrodes and piezoelectric elements are laminated iteratively. When power is applied to the electrodes, the piezoelectric elements may expand and contract iteratively in a horizontal direction. Power may be provided from the board 120 connected to an external power line. The piezoelectric actuator 130 may be installed extendedly in a horizontal direction.

Also, the piezoelectric actuator 130 may be fixed in the space formed by the horizontal portions 144 and the vertical portions 146 such that a horizontal deformation thereof is restrained, to deform the direction changing member 140 (i.e., to change a shape of the direction changing member 140) by a horizontal deformation thereof. Thus, a vertical upper portion of the piezoelectric actuator 130 may be attached to the horizontal portions 144 (please see FIG. 2B). Also, both horizontal ends of the piezoelectric actuator 130 may be attached to the vertical portions 146 (please see FIG. 2C). Alternatively, vertical upper portions and both horizontal ends of the piezoelectric actuator 130 may be attached to the horizontal portions 144 and the vertical portions 146 (please see FIG. 2A).

The piezoelectric element may be made of a piezoelectric material, preferably, a lead zirconate titanate (PZT) ceramic material, or the like. Of course, the present invention is not limited thereto.

The vibrator 150 may be disposed on an upper portion of the direction changing member 140, specifically, on an upper portion of the coupling portion 148a as an outer end of the displacement extending portion 148. The vibrator 150 may be a weight made of a high specific gravity material. The vibrator 150 may be made of a copper-based material such as brass, or the like, or a tungsten material.

The vibrator 150 may be disposed extendedly in a horizontal direction. Namely, the vibrator 150 may be disposed extendedly relative to the piezoelectric actuator 130 and have a portion protruded to outer sides of the outer end of the piezoelectric actuator 130.

The vibrator 150 may have a weight adding portion 152 extending downwardly in a vertical direction on an outer side of the outer end of the piezoelectric actuator 130. The weight adding portion 152 may be integrally provided with the vibrator 150 or may be separately provided and attached.

The displacement extending portion 148 may be provided such that the coupling portion 148a thereof, an outer portion thereof in a horizontal direction, is distant by as much as possible from the center of the piezoelectric actuator 130, in order to maximize a vertical displacement of the apparatus 100 for generating vibrations. The protruded portion maximally protruded from the vibrator 150 in a horizontal direction may be coupled to the coupling portion 148a. In detail, the portion in which the weight adding portion 152 is provided may be coupled to the coupling portion 148a.

Meanwhile, a holder 155 may be interposed between the vibrator 150 and the direction changing member 140, specifically, the coupling portion 148a as an outer end of the displacement extending portion 148. The holder 155 may have a shape covering the vibrator 150.

Figure 6:
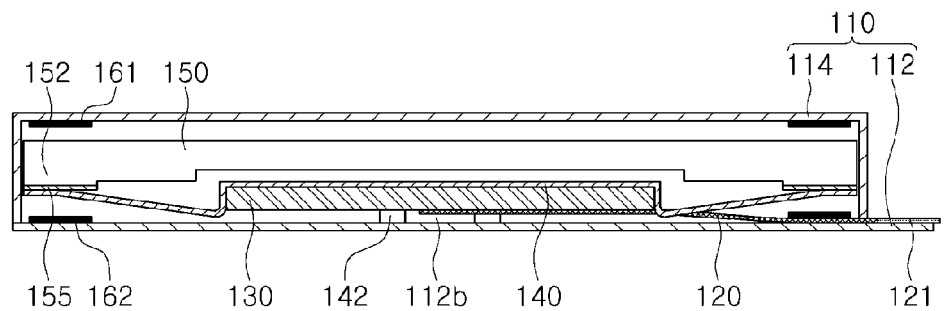
FIGS. 6 and 7 are schematic cross-sectional views of an apparatus for generating vibrations according to another embodiment of the present invention.
Figure 7:
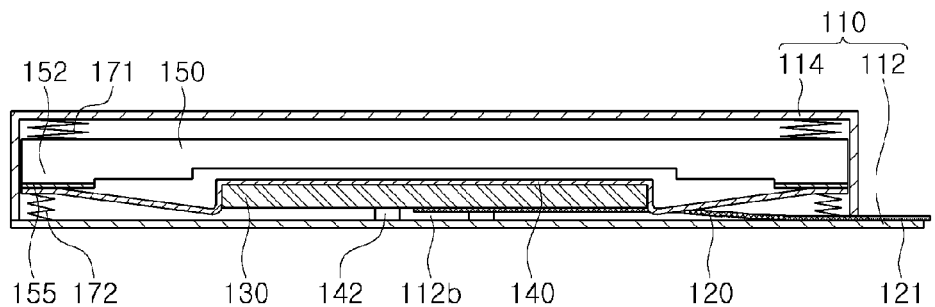

FIGS. 6 and 7 are schematic cross-sectional views of an apparatus for generating vibrations according to another embodiment of the present invention. Hereinafter, members that may be added to the apparatus 100 for generating vibrations according to an embodiment of the present invention will be described. Hereinafter, only portions different from those of the apparatus 100 for generating vibrations according to an embodiment of the present invention described above with reference to FIGS. 1 through 5 will be described and a description of the same portions may be replaced by the foregoing description.

Referring to FIG. 6, an apparatus 200 for generating vibrations according to an embodiment of the present invention may include dampers 161 and 162 provided on inner surfaces of the housing 110. Namely, the vibrator 150 is disposed in the internal space of the housing 110 and vibrates in the vertical direction, so the vibrator 150 may be brought into contact with the inner surfaces of the housing 110 in the vertical direction.

Thus, the dampers 161 and 162 are provided on the inner surfaces of the housing 110 in the vertical direction.

In FIG. 6, it is illustrated that the dampers 161 and 162 are provided on the inner surfaces of the housing 110, but the dampers may also be provided on an upper surface or a lower surface of the vibrator 150 in the vertical direction.

In particular, the dampers 161 and 162 may be disposed on an outer end of the vibrator 150 or an inner surface of the housing 110 facing the outer end of the vibrator 150.

The dampers 161 and 162 may be made of a material including at least any one of urethane foam, silicon foam, and rubber in order to absorb noise as an elastic body. In particular, the dampers 161 and 162 may be formed of PORON®.

Referring to FIG. 7, an apparatus for generating vibrations according to an embodiment of the present invention may further include additional elastic members disposed between inner surfaces of the housing 110 and the vibrator 150.

The additional elastic members may be coil springs 171 and 172. One or more coil springs 171 and 172 may be installed between outer ends of the vibrator 150 and the internal surfaces of the housing 110 facing the outer ends of the vibrator 150.

The coil spring 171 may be provided between an upper surface of the vibrator 150 and the ceiling of the housing 110 or the case 114, and the coil spring 172 may be provided between a lower surface of the vibrator 150 and the bottom of the housing 110 or the bracket 112.

The additional elastic members may serve to add vibrating power to the vibrator 150 in addition to vibrations generated by the piezoelectric actuator 130 or serve as a damper.

As set forth above, according to embodiments of the invention, an apparatus for generating vibrations capable of implementing rapid responsiveness by using a linear elastic member, while utilizing a piezoelectric element as an actuator can be provided.

While the present invention has been shown and described in connection with the embodiments, it will be apparent to those skilled in the art that modifications and variations can be made without departing from the spirit and scope of the invention as defined by the appended claims.

What is claimed is:

1. An apparatus for generating vibrations, the apparatus comprising:
   a housing having an internal space;
   a direction changing member installed in the housing so as to be disposed in the internal space;
   a piezoelectric element fixed to the direction changing member such that a horizontal deformation thereof is restrained, and deforming the direction changing member by a horizontal deformation thereof; and
   a vibrator fixed to the direction changing member and vertically displaced in a vertical direction according to a vertical deformation of the piezoelectric element,
   the direction changing member comprising
      a fixed end fixed to the housing,
      horizontal portions extending from the fixed end to both sides in a horizontal direction,
      vertical portions extending from horizontal outer portions of the horizontal portions downwardly in a vertical direction, and
      displacement extending portions extending from vertical lower portions of the vertical portions to both sides in a horizontal direction and having the vibrator fixed to both sides thereof in the horizontal direction.

2. The apparatus of claim 1, wherein the piezoelectric element is provided in a space formed by the horizontal portions and the vertical portions.

3. The apparatus of claim 2, wherein a vertical directional upper portion of the piezoelectric element is attached to horizontal portions.

4. The apparatus of claim 2, wherein horizontal directional both ends of the piezoelectric element are attached to the vertical portions.

5. The apparatus of claim 2, wherein the vertical directional upper portion and the horizontal directional both ends of the piezoelectric element are attached to the horizontal portions and the vertical portions.

6. The apparatus of claim 1, wherein portions of the displacement extending portions coupled to the vertical portions are lower than portions thereof fixed to the vibrator in a vertical direction.

7. The apparatus of claim 6, wherein the displacement extending portions include a coupling portion whose portion fixed to the vibrator is parallel to a horizontal direction.

8. The apparatus of claim 1, wherein the horizontal portions and the vertical portions are coupled at a right angle.

9. The apparatus of claim 1, wherein the horizontal portions are warped as the piezoelectric element is deformed in a horizontal direction.

10. The apparatus of claim 1, wherein the housing includes a bracket on which the direction changing member is installed, and a case covering the bracket and incorporated with the bracket to provide an internal space.

11. The apparatus of claim 10, further comprising a board attached to the bracket and providing power to the piezoelectric element.

12. The apparatus of claim 1, wherein the vibrator is a weight made of a high specific gravity material.

13. The apparatus of claim 12, wherein the weight is longer than the piezoelectric element in the horizontal direction.

14. The apparatus of claim 13, wherein the weight includes a weight adding portion extending downwardly in a vertical direction on an outer side of the outer end of the piezoelectric element.

15. The apparatus of claim 1, wherein a damper is provided in at least one member in a portion where the vibrator and an inner surface of the housing face one another.

16. The apparatus of claim 15, wherein the damper is disposed on an outer end of the vibrator or an inner surface of the housing facing the outer end of the vibrator.

17. The apparatus of claim 15, wherein the damper is made of a material including at least one of urethane foam, silicon foam, and rubber.

18. The apparatus of claim 15, wherein the damper is made of a material which is elastic and absorbs noise.

19. The apparatus of claim 15, wherein the damper is formed of least one coil spring.

20. The apparatus of claim 1, wherein the piezoelectric element has a square pillar shape in which a length thereof in a horizontal direction is greater than a height thereof in a vertical direction.

21. The apparatus of claim 20, wherein the housing has a square pillar shape in which a length thereof in a horizontal direction is greater than a height thereof in a vertical direction.

22. The apparatus of claim 1, wherein the direction changing member comprises:
at least two horizontal portions extending from the fixed end to both sides in a horizontal direction.

23. The apparatus of claim 22, wherein the piezoelectric element is provided in a space formed by the horizontal portions and the vertical portions.

* * * * *